United States Patent [19]

Rosinek et al.

[11] 4,437,098
[45] Mar. 13, 1984

[54] APPARATUS FOR ELECTRONICALLY READING MECHANICAL METERS HAVING NON-SIMULTANEOUSLY CHANGING DIGITS

[75] Inventors: Shlomo Rosinek, Kiron; Isaac Rinkewich, Tel-Aviv; Boris Khurgin, Haifa, all of Israel

[73] Assignee: Matam, Ltd., Tel-Aviv, Israel

[21] Appl. No.: 315,148

[22] Filed: Oct. 26, 1981

[51] Int. Cl.³ ............... G08C 19/00; G08C 19/36; G08C 19/16
[52] U.S. Cl. ............... 340/870.02; 250/231 SE; 340/347 P; 340/870.19; 340/870.29
[58] Field of Search ............... 340/870.02, 870.03, 340/347 P, 870.19, 870.24, 870.29; 250/231 SE

[56] References Cited

U.S. PATENT DOCUMENTS 2,796,598  6/1957  Cartwright ............... 340/870.29
3,935,568  1/1976  Samuel ............... 340/347 P

OTHER PUBLICATIONS

*U.S. Animal Health Association's 80th Annual Meeting,* Holm, pp. 186–194, 1976.
*Meat Industry Research Conference,* Holm, Mar. 24–25, 1977.
"Passive Electronic Identification and Temperature Monitoring System", Bobbett, Jan.–Dec. 1976.

*Primary Examiner*—James J. Groody
*Attorney, Agent, or Firm*—James & Franklin

[57] ABSTRACT

The digits of the meter are each represented by the position of a member rotatable to one of ten different positions. The positions of the members do not change simultaneously. A set of first and second sensors are provided for each member. Each sensor is effective, when actuated, to sense the position of the member associated therewith. In each set, the first and second sensors are spaced apart, along the direction of movement of the member, by a distance less than the distance between adjacent positions of the member. The first sensor in each set is actuated, in sequence, to detect the position of the corresponding member and to generate a code representative of the sensed position. The codes for the first meter reading are converted into a first number, which is stored. After a delay sufficient to permit all of the members to change position, the second sensor in each set is actuated, in sequence. Each of the second sensors generates a code representative of the position of the corresponding member. The codes from the second meter reading are converted into a second number and stored. The stored numbers are then compared and the appropriate one selected.

16 Claims, 9 Drawing Figures

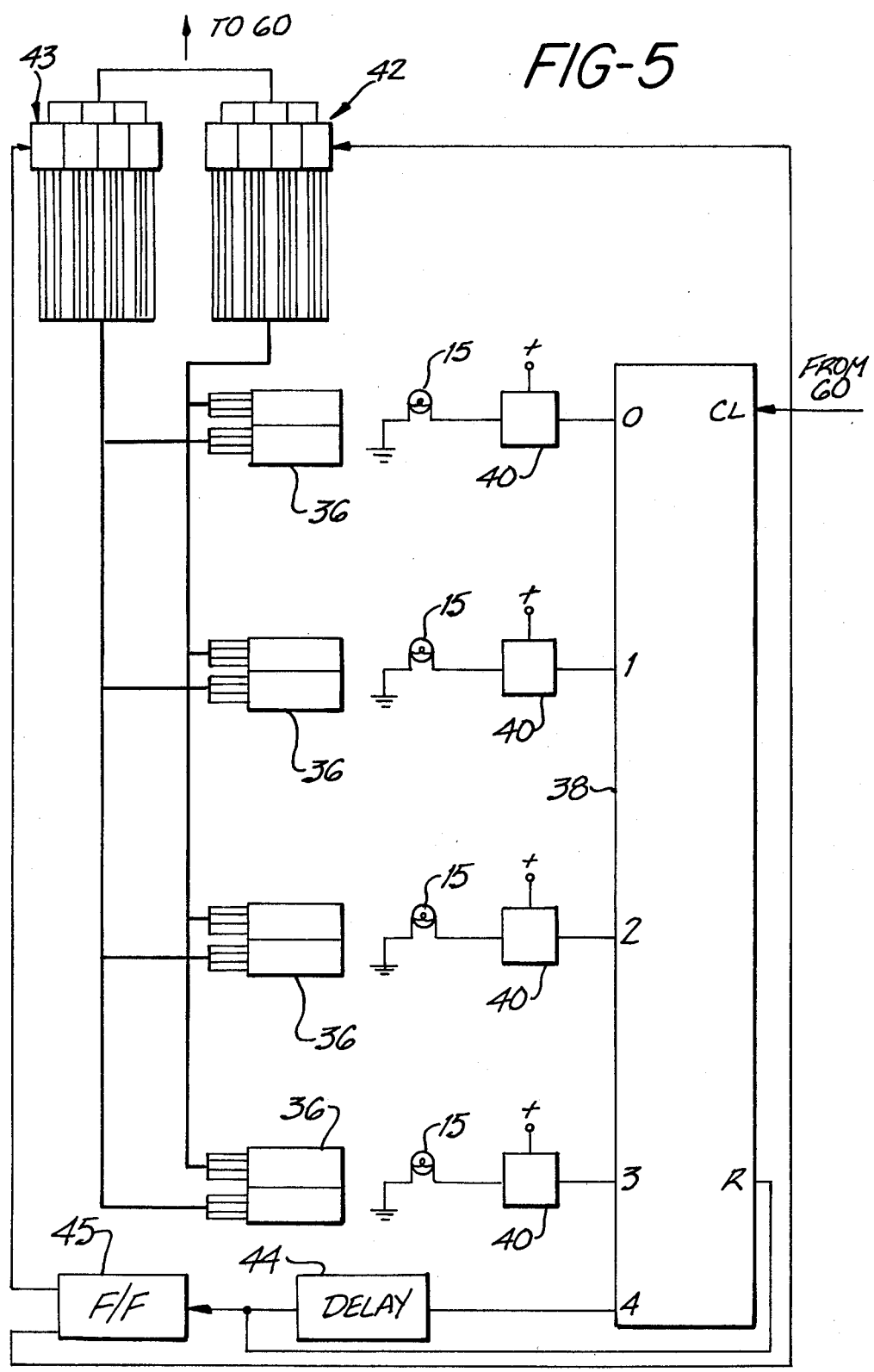

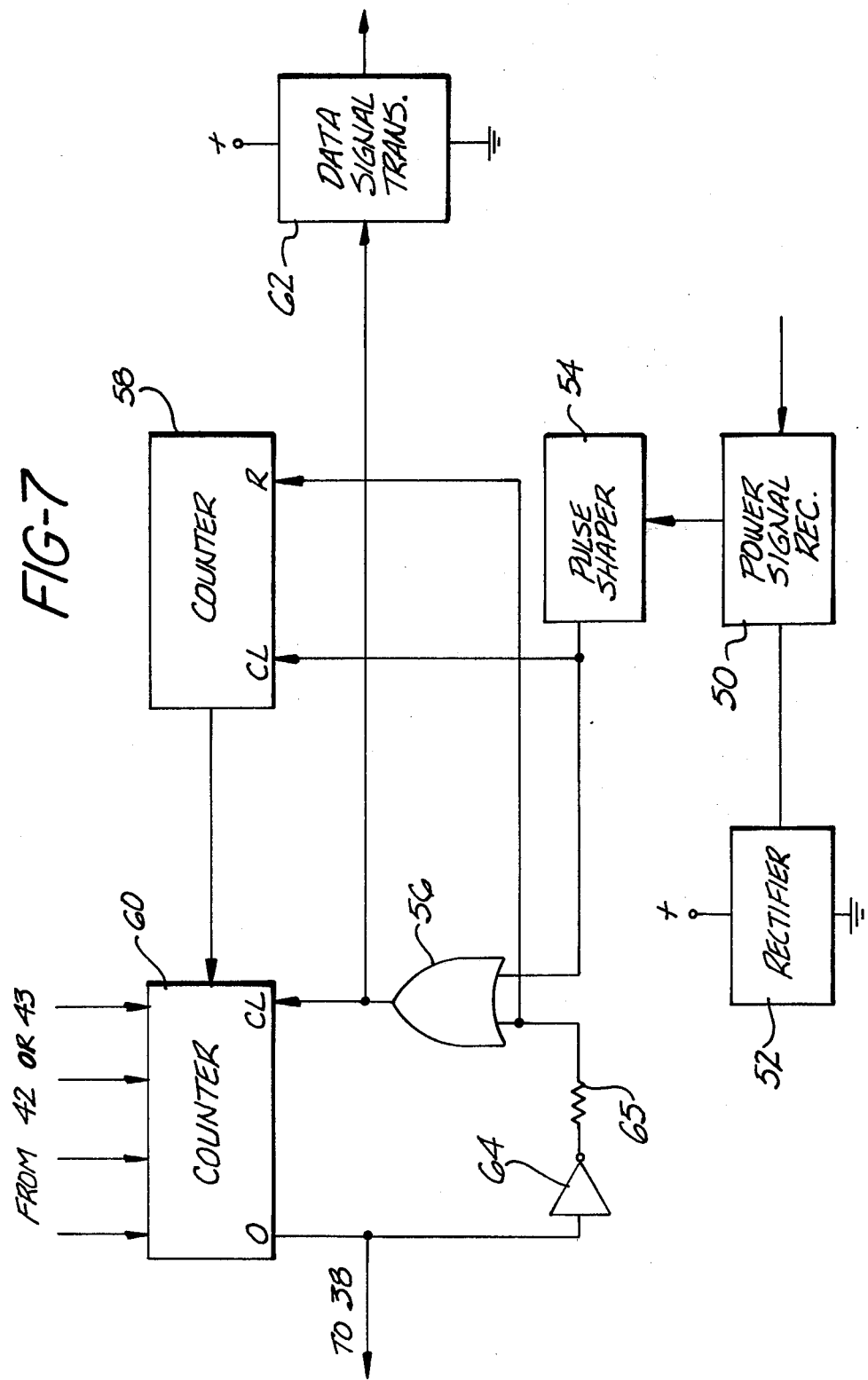

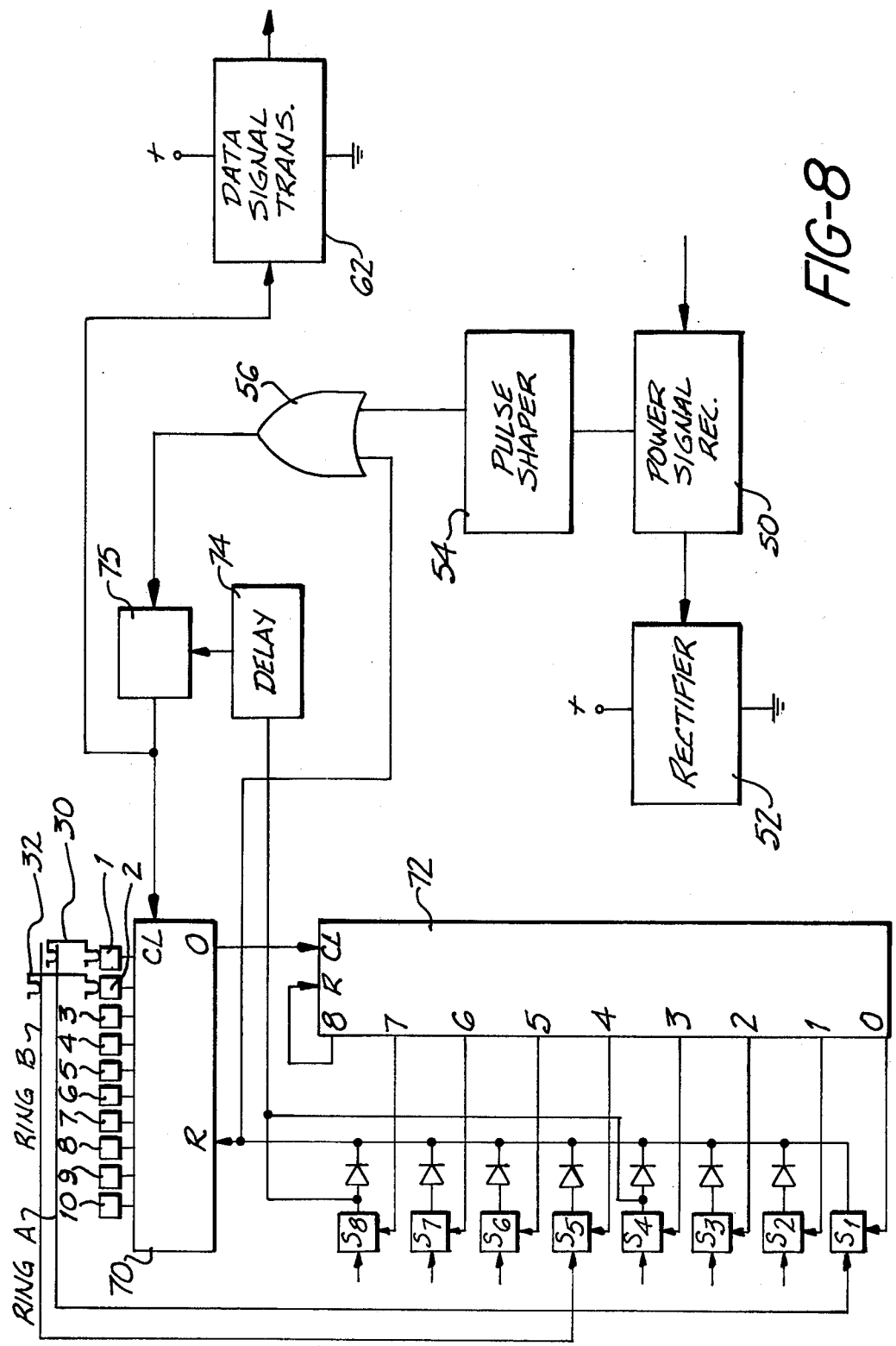

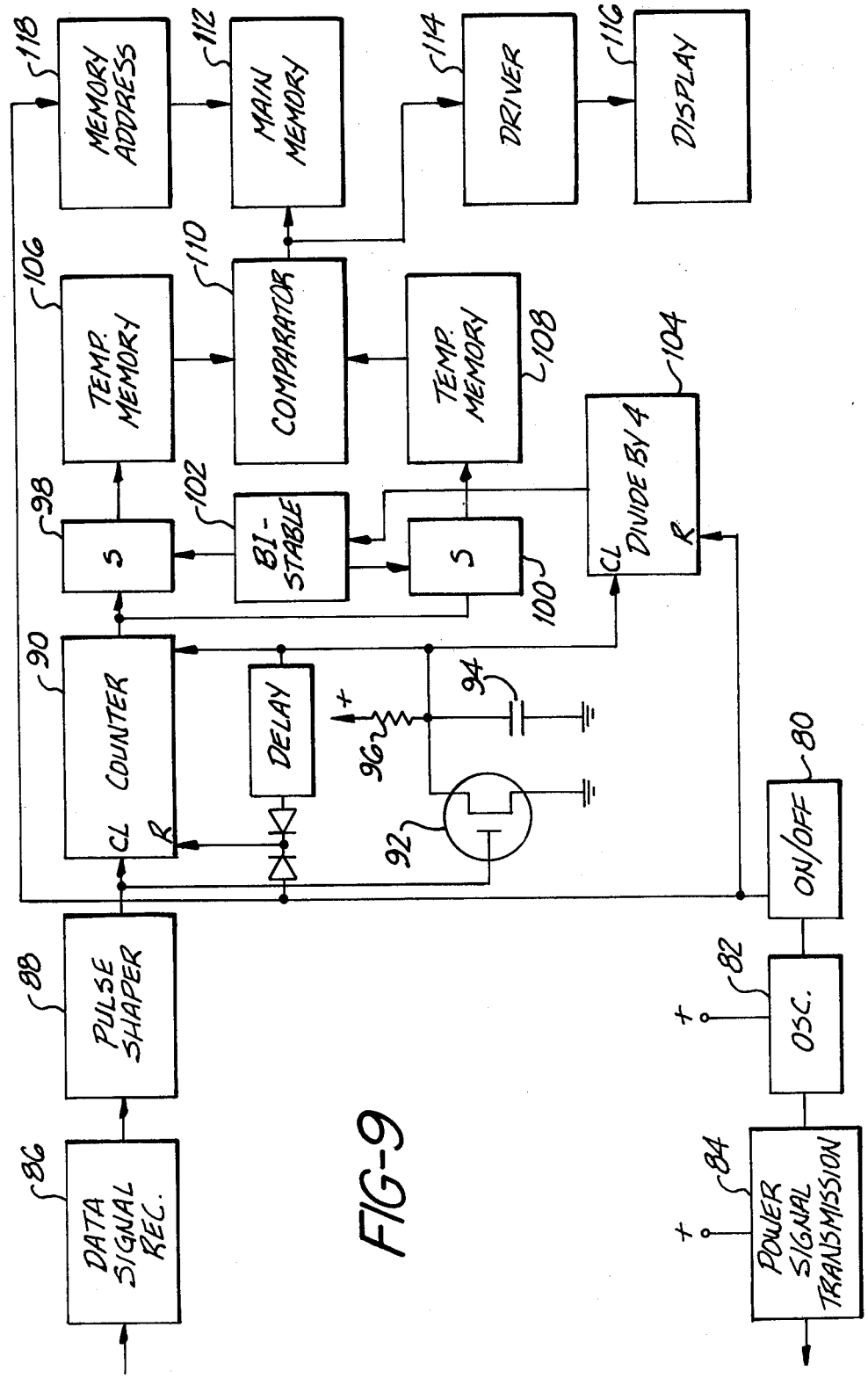

APPARATUS FOR ELECTRONICALLY READING MECHANICAL METERS HAVING NON-SIMULTANEOUSLY CHANGING DIGITS

The present invention is a continuation-in-part of co-pending U.S. patent application Ser. No. 315,151, filed Oct. 26, 1981, and entitled "Apparatus For Electronically Reading Mechanical Meters" which, in turn, is a continuation-in-part of co-pending U.S. Pat. application Ser. No. 315,153, filed Oct. 26, 1981, and entitled "Passive Identfication System" which, in turn, is a continuation-in-part of U.S. Pat. application Ser. No. 231,449, filed Feb. 4, 1981, and entitled "Passive Animal Identification System", all of the afore-mentioned applications having the inventors hereof.

The present invention relates to apparatus for electronically reading mechanical meters and, more particularly, to an apparatus for electronically reading mechanical meters having non-simultaneously changing digits.

U.S. application Ser. No. 315,151 discloses apparatus for electronically reading mechanical meters through the use of a remote unit which, when brought in proximity to each meter, energizes the meter reading apparatus associated with that meter such that the apparatus generates a digital code representative of each digit of the meter reading. The digital codes are each converted into pulse trains, each pulse train having a number of pulses which is representative of the digit. In addition, pulse trains representative of an identification of the meter are generated. All of the pulse trains are arranged in sequence to form a data signal which is transmitted to the remote unit. In the remote unit, the pulses in each pulse train of the data signal are counted and stored as numbers representing the meter reading and the meter identification.

Conventional mechanical meters used to monitor the flow of water, gas, or other fluids, generally employ a mechanical counter/display mechanism which comprises or is driven by one or more movable members, often in the form of rotatable wheels or discs or the like, one of which is provided for each digit of the meter reading. The position of each movable member defines the reading of the corresponding digit.

In the above-mentioned application, a single sensor is provided for each movable member. Such members are usually movable to one of ten different positions representing "0", "1", "2", "3", "4", "5", "6", "7", "8", and "9", respectively. The sensor detects the position of the corresponding member and translates the sensed position into a digital code, preferably in either BCD form or decimal form. The sensors are actuated in the sequence of the digits and each code is, in turn, converted into a pulse train having a number of pulses which is representative of the position of the member. These pulse trains make up the data signal which is transferred to the remote unit wherein the data signal is translated into a number, containing the required number of digits and stored.

While this system has a great number of advantages, as explained in the above-mentioned application, it suffers from one disadvantage. This disadvantage relates to the fact that the digits in conventional meters do not change simultaneously. Thus, if the meter is being read at the time when the digits are changing, an erroneous meter reading results. This is illustrated by the following example.

Assume that at a first point in time the meter reading is 1279. After a change in the digits has been completed, the meter will read 1280. However, because of the play that always exists between the parts of the mechanical movement and other tolerances in the system, the change is performed through an intermediate step. For example, the meter reading goes from 1279 to 1270 and then to 1280 or, alternatively, from 1279 to 1289 and then to 1280. If the meter is read during the intermediate step, an erroneous meter reading will be the result.

In general, this problem is overcome in the present invention by providing a set of two functionally independent and physically separated sensors for each movable member. The first sensor associated with each member is actuated, in sequence, to read the meter at a first point of time. Thereafter, the second sensor for each member is actuated, in sequence, to read the meter at a second point of time. The second meter reading takes place at a time after the first meter reading which is greater than the time it takes for all of the digits to change. The numbers obtained from the first and second meter readings are stored and compared. Only the appropriate number (usually the higher of the two numbers) is retained, while the other is discarded. In this way, an accurate meter reading is always assured, regardless of whether the digits have changed non-simultaneously during the reading.

Two preferred embodiments of the present invention are disclosed herein. One embodiment utilizes an optical system to sense the position of the movable member. In the second embodiment, the position of the movable member is electrically sensed. The optical embodiment has an advantage over the electrical embodiment in that no physical contact with the movable member is required. Since physical contact with the movable member, however slight, places an additional load on the movable member, a slight inaccuracy in the meter may result. Thus, when high accuracy is required, the optical embodiment is preferred. In other situations, the electrical embodiment is suitable and, in fact, may be preferable because of its lower cost.

It is, therefore, a prime object of the present invention to provide apparatus for electronically reading mechanical meters which eliminates the problems associated with non-simultaneously changing digits.

It is another object of the present invention to provide apparatus for electronically reading mechanical meters having non-simultaneously changing digits, wherein the meter is read without the application of any load thereto.

It is another object of the present invention to provide apparatus for electronically reading mechanical meters having non-simultaneously changing digits, wherein the meter is read with only a minimum load applied thereto.

It is another object of the present invention to provide apparatus for electronically reading mechanical meters having non-simultaneously changing digits, wherein fiber optics may be utilized to reduce the number of sensors required.

It is another object of the present invention to provide apparatus for electronically reading mechanical meters having non-simultaneously changing digits, wherein the apparatus comprises conventional, relatively simple parts which cooperate together in a reliable fashion for an extended useful life.

In accordance with the present invention, apparatus is provided for detecting the position of first and second members, each of which is movable to one of a given number of positions. The apparatus comprises, for each member, a first means, effective when actuated, to sense the position of the member and a second means, effective when actuated, to sense the position of the member. The first and second sensing means are spaced apart, along the direction of movement of the member, by a distance less than the distance between adjacent positions of the member. Means are provided for actuating each of said first sensing means, in sequence. Means are provided for actuating each of said second sensing means, in sequence, a given time after the actuation of the first sensing means. The given time is greater than the time it takes for both members to move between adjacent positions. First means are provided for storing a first number representative of the positions sensed by the first sensing means. Second means are provided for storing a second number representative of the positions sensed by the second sensing means. Means are provided for comparing the stored numbers and for selecting one of the stored numbers.

In accordance with the first embodiment of the present invention, each of the members carries a given number of patterns thereon. Each of the patterns represents one of the member positions. The first and second sensing means each comprise means for sensing the pattern aligned therewith and for generating a code representative of the aligned pattern.

Each member may comprise a rotatable wheel or drum. The patterns comprise light transmissive or light reflective areas on the surface of the drum. The first and second sensors each comprise photosensitive signal generating means. Means are provided for illuminating the patterns on the drum.

Each of the patterns comprises a plurality of sections. The photosensitive means comprises a plurality of photo cells. A different one of the photo cells is aligned with each of the sections in the pattern.

Preferably, each of the patterns comprises four sections. In this instance, the code representative of the aligned patterns is in BCD form.

In order to reduce the number of photo cells required, a single photosensitive signal generating means for both members may be utilized. In this instance, two sets of optical fibers are utilized for each drum. The input end of one set of fibers is situated at one point along the drum and the input ends of the second set of fibers is situated at a position spaced therefrom, adjacent another point in the drum. The output ends of both sets of fibers from both drums terminate adjacent a single photosensitive signal generating means.

In this instance, the first member is illuminated and the photosensitive signal generating means reads the pattern transferred thereto by a first set of optical fibers associated with that member. Then, the illumination of the first member is terminated and the second member is illuminated. The photosensitive signal generating means then reads the pattern on the second member transferred thereto by means of the first fiber optic bundle associated with the second member. Thereafter, the first member is again illuminated and the pattern read by a second fiber optic bundle associated therewith. The second member is then illuminated and read via the second fiber optic bundle associated with the second member.

In the second preferred embodiment of the present invention, said given number of spaced conductive sections are associated with each member. One of the sections corresponds to each of the positions. Each of the sensing means comprises a contact carried by the member. Each of the contacts has one end situated to engage the section aligned therewith, and a second end connected to the corresponding storage means. Each of the storage means comprises means for applying a signal to each of the sections, in sequence, means for detecting the presence of the signal on the contact connected thereto and means for recording the number of the section to which the signal is applied, when the presence of the signal on the contact connected thereto is detected.

When each member takes the form of a rotatable disc, the contacts are spaced along and carried by one side of the disc and the sections are situated on a base adjacent to that side of the disc. In this instance, the sections are situated in a circular pattern on the base.

The base also includes first and second conductive rings. Each of the rings continuously engages said other end of a different one of the contacts as the contacts are moved by the disc. The detecting means is connected to each of the rings, in turn.

The apparatus further comprises means, connected to each set of said first and second sensors, for generating a data signal. The data signal comprises pulse trains, each having a number of pulses representative of a different one of the sensed positions. Means are provided for transmitting the data signal.

The apparatus further comprises means for receiving the data signal and means for counting the number of pulses in each of the pulse trains. Means are also provided for transferring each of the counted numbers to the storing means.

Means are provided for generating a power signal and for transmitting the power signal. Means are provided for receiving the power signal and for applying the received power signal to actuate the first and second sensing means in each set of sensing means, in the proper sequence.

The apparatus further comprises means for converting the power signal into a power signal pulse train. The data signal generating means comprises means for selecting first and second given numbers of pulses from the power signal pulse train for each member and forming the data signal therefrom. The given numbers of pulses are representative of the first and second sensed positions, respectively.

To the accomplishment of the above and to such other objects which may hereinafter appear, the present invention relates to apparatus for electronically reading mechanical meters having non-simultaneously changing digits, as described in the following specification and recited in the annexed claims, taken together with the accompanying drawings, wherein like numerals refer to like parts, and in which:

FIG. 5 is a schematic diagram of a portion of the meter reading apparatus of the present invention, incorporating several of the sensing means which are illustrated in FIG. 1;

FIG. 7 is a block diagram of a portion of the meter reading apparatus which forms and transmits a data signal in accordance with the position sensed by the sensors illustrated in FIGS. 5 or 6;

FIG. 8 is a block diagram of an embodiment of the data signal generating and transmitting means utilizable in conjunction with the sensing means illustrated in FIGS. 3 and 4; and FIG. 9 is a block diagram of the data signal receiving and recording unit which forms a portion of the present invention.

Figure 1:
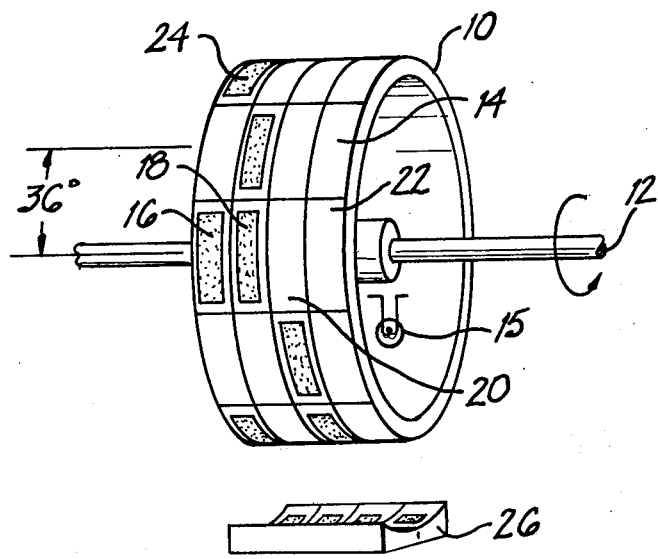
FIG. 1 is an isometric view of a first preferred embodiment of the sensing means utilizable as a portion of the present invention.

FIG. 1 depicts a first preferred embodiment of the sensing means of the present invention which includes a hollow wheel or disc-like member 10 which is rotatable on a shaft 12 to any one of ten different positions, representing the numerals from 0 to 9. Adjacent positions are thus 36° apart. A meter will normally comprise a plurality of such discs 10, one for each digit in the meter reading.

The outer surface of disc 10 is divided into ten separate areas 14, each of which represents one of the ten possible rotational positions of the disc. Each area 14 is further subdivided into four axially aligned regions 16, 18, 20 and 22, respectively. Each region 16, 18, 20 and 22 for each area 14 is circumferentially aligned with the corresponding region in each of the other areas 14. Each disc 10 is provided with an energizable light source 15 located therein which will illuminate the areas 14 aligned with the photosensitive signal generating means.

Each of the regions 16, 18, 20 and 22 is either opaque or contains a light transmissive section 24. The light transmissive sections 24 for each area 14 represent the number which corresponds to the rotational position defined by that area 14. The light transmissive sections 24 within one area 14 are spaced from the light transmissive sections in the adjacent area 14 by a given distance a.

Figure 2:
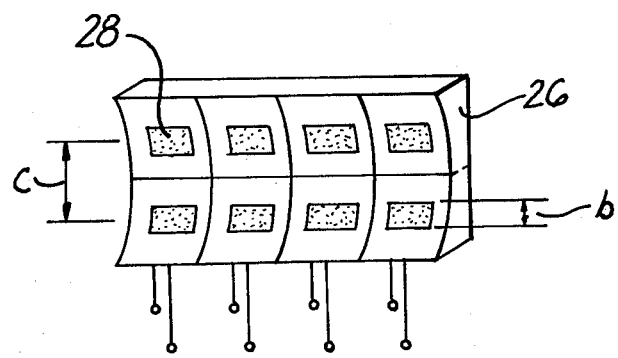
FIG. 2 is a top view of a portion of the sensing means illustrated in FIG. 1.

The sensor means 26, used in conjunction with each of the discs 10, comprises eight photoelectric cells 28, arranged in two rows of four sensors each. This is best seen from FIG. 2. The width b of each of the sensors 28 is smaller than the distance a between segments 24 on adjacent areas 14. This spacing is important because if disc 10 is in the midst of a position change, it is not possible for a single row of photo cells 28 to be aligned with sections 24 on two adjacent regions 14 simultaneously. In addition, the distance c between the center lines of each row of photo cells 28 must be smaller than the distance between rotational positions of the member, that is, less than 36° apart, but larger than the distance a between the light transmissive sections 24 on two adjacent areas 14. This is important because it insures that at least one of the rows of photo cells 28 will be aligned with one area of light transmissive sections 24, at all times.

Photosensitive signal generating means 26 has eight sets of outputs, four of which are connected to photo cells 28 on the top row of photo cells, and four of which are connected to photo cells 28 on the bottom row of photo cells. Each row of photo cells will generate a digital code in BCD form, representative of the numerals 0 through 9 of the area 14 aligned therewith. Thus, photosensitive signal generating means 26 is capable of generating two BCD codes. If the disc 10 is stationary, then the codes generated by the photoelectric signal generating means 26 will be the same. However, if disc 10 changes positions between the time when the output of the first row of photo cells is read and the time when the output of the second row of photo cells is read, then the first row of photo cells will generate a BCD code representative of the number prior to the positional change and the second row of photo cells will generate a BCD code representative of a number after the positional change. This is because the second BCD code for each member is not read until a given time after the first BCD code is read. This given time is longer than it takes for all discs 10 to move from one position to the other.

In one form of this embodiment, a photosensitive generating means 26 is provided for each disc 10 in the meter. Normally, the meter reading consists of four digits, thereby requiring four separate rotatable discs 10. Accordingly, four photosensitive signal generating means 26 are required, each containing eight photo cells 28, arranged in two rows of four.

However, in order to save costs, it is possible to provide only a single photosensitive signal generating means for each meter and to interconnect each of the discs with the single photosensitive signal generating means through the use of conventional fiber optic bundles. In this case, the photosensitive signal generating means 26, illustrated in FIG. 1, is replaced by a block of molded plastic or the like which retains the input ends of two separate fiber optic bundles. Each bundle of fibers contains four individual fibers, the input ends of which are arranged in a row. The input ends of the fibers and the rows of the input ends of the fibers are positioned and spaced apart in the identical manner described above with respect to photo cells 28, shown in FIG. 2.

Thus, for each disc 10, two bundles of fibers, having four fibers each, is provided. The output ends of the first fiber optic bundle associated with each of the discs 10 all terminate adjacent the top row of photo cells 28 of the single photosensitive signal generating means 26. The first fiber in each bundle terminates adjacent the first photo cell 28 in the first row of cells. The second fiber in each bundle terminates adjacent the second photo cell in the first row of cells, etc. Similarly, the output ends of all of the second fiber optic bundles for each disc 10 terminate adjacent the photo cells 28 which form the second row of photo cells 28 in photosensitive signal generating means 26. Again, the first fiber in each second bundle terminates adjacent the first photo cell 28 in the second row, the second fiber in each bundle terminates adjacent the second photo cell in the second row, etc.

When fiber optic bundles are utilized in this manner, the first disc is illuminated and a BCD code generated by the first row of photo cells 28 is noted. The light source illuminating the first disc 10 is then deactuated and the light source illuminating the second disc 10 is actuated and the BCD code from the first row of photo cells is again noted. Each disc 10 is illuminated, in turn, and the BCD codes generated by the first row of photo cells are noted each time. When the last disc in sequence has been illuminated, the process begins again, after a time delay longer than the time it takes for all of the discs to change position. At this point, the first disc is again illuminated, but now the BCD code generated by the second row of photo cells 28 is noted. The light source illuminating the first disc 10 is deactuated and the light source illuminating the second disc 10 is energized and the BCD code generated by the second row of photo cells is again noted. This process continues until the position of each of the discs 10 has been noted a second time.

Whether multiple photosensitive signal generating means, or only a single photosensitive signal generating means is utilized, the reading process is done in a simple, straight-forward manner under the control of a line decoder and a plurality of electronic switches which serve to energize the light sources associated with the discs in the proper sequence. This is explained in greater detail in conjunction with FIGS. 5 and 6.

Figure 4:
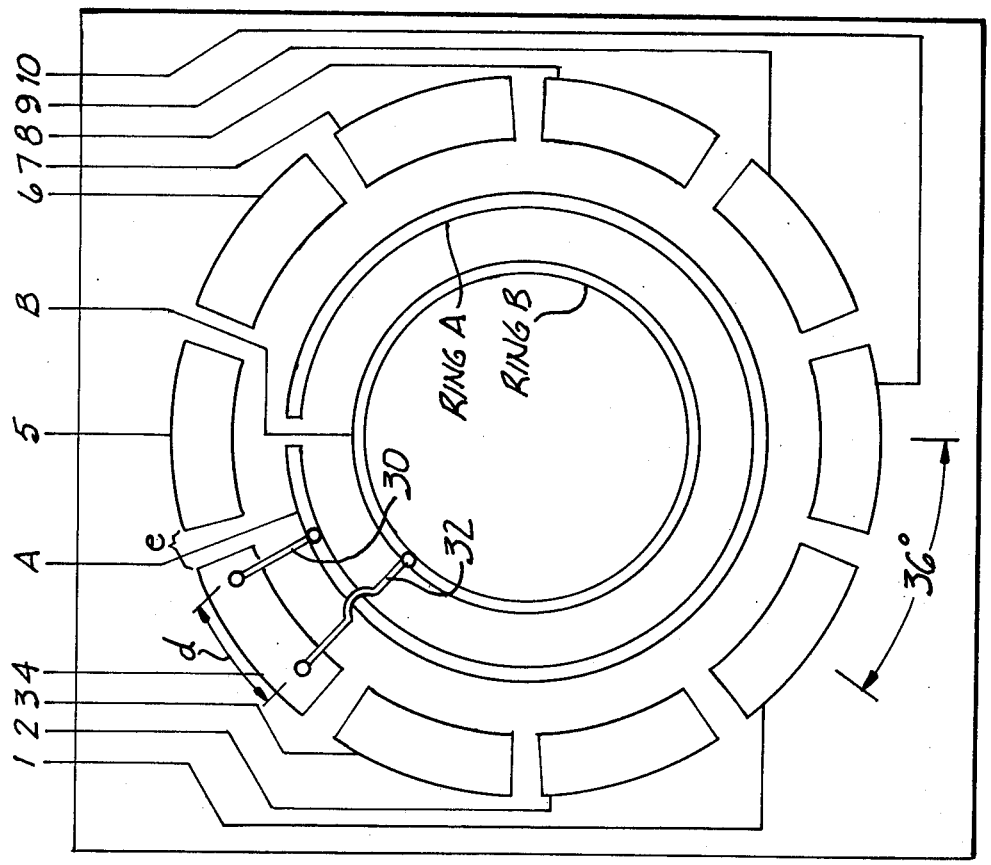
FIG. 4 is a side view of a portion of the sensing means illustrated in FIG. 3.
Figure 3:
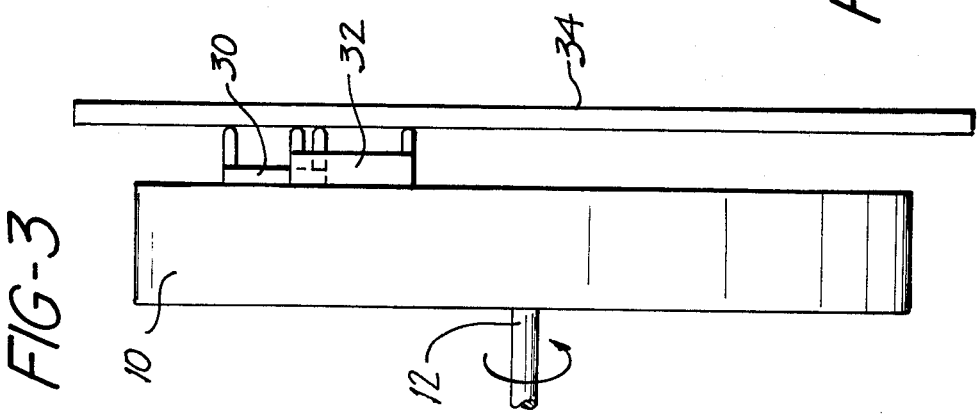
FIG. 3 is a front view of a second preferred embodiment of the sensing means utilizable in conjunction with the present invention.

FIGS. 3 and 4 illustrate a second preferred form of the position sensing means, wherein the position of the rotatable disc is sensed electrically. FIG. 3 shows disc 10 which is rotatable on shaft 12, as in the first preferred embodiment, to any one of ten different positions 36° apart. However, in this case, disc 10 carries with it two electrical contacts 30, 32, each of which extend in a radial direction along a line from the axis of disc 10 towards the circumference thereof. Contacts 30 and 32 are rotationally offset by an angular distance d, less than 36°, as is best seen in FIG. 4.

FIG. 4 shows a stationary base 34 which is situated adjacent disc 10, such that the ends of contacts 30 and 32 are in engagement therewith. Disc 10 comprises ten conductive sections 36, arranged in a circular pattern. Each section 36 corresponds to a different one of the rotational positions of disc 10. Each section 36 is spaced from the adjacent sections 36 by a distance e which is less than the distance d between contacts 30 and 32. However, the width of each contact is smaller than distance e. Accordingly, it is assured that at least one of the contacts 30, 32 will be in electrical contact with at least one of the sections 36 at every angular position during the rotation of disc 10, but at no time will a single contact engage two different sections 36. Each of the conductive sections 36 on base 34 are connected to a different one of ten inputs, designated 1 through 10, respectively.

Within the circle formed by conductive sections 36 are two continuous conductive rings A and B. Each of the rings A and B are connected to a different output lead, labelled A or B.

Each of the contacts 30 and 32 has one end thereof in continuous engagement with a different one of the rings A or B at every angular position within the rotation of disc 10. The other ends of each of the contacts 30 and 32 are aligned with each other and with the circle formed by conductive sections 36.

As is explained in greater detail below, a high signal is applied to each of the inputs 1–10, in sequence. During the first reading, output A is monitored. When output A receives the high signal, indicating that contact 30 has connected ring A to the then energized section 36, the section 36 which is energized is noted and this section designates which of the possible rotational positions disc 10 is in at that point. After a suitable time delay, the sequence begins again and the high signal is applied to each of the inputs in turn. During this sensing operation, output B is monitored. When output B receives a high signal, because contact 32 has connected ring B to the section 36 being energized, the process stops and the number of the input which is being energized when the output is received at output B is noted. This reflects the position of disc 10 during the second sensing operation.

A separate base 34 is provided for each rotatable disc 10 in the meter. In addition, a separate line decoder is provided for each base 34 which is present in the meter. As in the previous embodiment, the rotational position of each disc is sensed in sequence by monitoring the output A from each base. After a time delay greater than the time it takes for all of the discs 10 to change position, the rotational position of each of the discs 10 is again sensed in sequence, this time, output B from each base 34. is monitored.

FIG. 5 schematically represents the circuitry required, in accordance with the first version of the optical embodiment of the sensing means, to scan the position of each of four rotatable discs 10 (not shown), in sequence, during two separate sensing operations. The circuitry comprises a line decoder 38 having a clock input, a reset input, and five operative outputs numbered 0, 1, 2, 3, and 4, respectively. Each of the first four of the outputs 0, 1, 2, and 3 of decoder 38 is connected to a separate electronic switch 40. Each of the electronic switches 40 has an input connected to the positive terminal of a power signal rectifier which generates a DC power signal when the meter is energized for reading. The output of each switch 40 is connected to a different light source 15 associated with a different one of the discs 10.

When a power signal is received, decoder 38 will generate a high signal on its 0 output, causing electronic switch 40 connected thereto to energize the light source 15 associated therewith, thereby illuminating the first disc 10. A BCD code is generated by each row of photo cells in the photosensitive signal generating means 26 associated with the first disc 10. The code from the first row of cells will pass through circuit 42, made up of a series of four gates, one for each bit in the BCD code, to the input of a counter, because circuit 42 is actuated. However, a second circuit 43, similar to circuit 42, prevents the code from the second row of cells from being applied to the counter because circuit 43 is deactuated at this time. Each of the gates in circuits 42 and 43 can be an AND gate or an electronically controlled switch or the like.

Decoder 38 now receives a clock pulse which causes the high signal on output 0 to terminate and a high signal to be applied to output number 1 which, through the electronic switch 40 connected thereto, energizes light source 15 associated with the second disc 10. The BCD code generated by the first row of photo cells 28 in the photosensitive signal generating means 26 associated with the second disc 10 and passes through circuit 42 to the counter input. Similarly, on the next clock signal, the third disc, in turn, will be illuminated and the BCD code from the first row of photo cells 28 of the photosensitive signal generating means 26 associated with that disc will pass through circuit 42. On the next clock signal, the position of the fourth rotatable disc will be sensed in a similar manner.

On the fifth clock signal, a high signal will be generated on output 4 of decoder 38. This signal will be fed to the input of a delay circuit 44, which may be in the form of a shift register or any one of a number of well known timing circuits. After a time greater than the time it takes for all of the digit wheels to change position, delay circuit 44 generates a pulse which is applied both to the reset terminal of decoder 38 and to the input of a bistable circuit 45, such as a flip-flop. Circuit 45 has two outputs, only one of which will be high at a given time. Initially, the output connected to circuit 42 is high, actuating same to connect the outputs of the photo cells in the first row in each means 26 to the input of a counter. The pulse from delay circuit 44 causes the outputs of circuit 45 to change state. The second output of circuit 45 is connected to circuit 43 to actuate same when high.

Applying a pulse to the reset terminal of decoder 38 causes the decoder to reset such that a high signal is now once again applied to the 0 output. Applying the high signal to the control terminal of circuit 43 actuates the electronic switches therein to connect the outputs of the second row of photo cells in each means 36 to the input of the counter. The low signal from the first output of circuit 45 deactuates circuit 42. Thus, now only the BCD codes from the second row of photo cells 28 in each photosensitive signal generating means 26 will be applied to the input of the counter.

Applying a high signal to the 0 output of decoder 38 will again illuminate light source 15 associated with the first disc. The BCD code generated by the second row of photo cells 28 in the photosensitive signal generating means 26 associated with the first disc will pass through circuit 43. When the next clock signal is received by decoder 38, a high signal will be applied to output 1, energizing the light source 15 associated with the second disc such that the BCD code generated by the second row of photo cells 28 of the photosensitive signal generating means 36 associated with second disc 10 will pass through circuit 43.

In this manner, the position of each disc 10, in sequence, is monitored by the first sensor. After a time delay greater than the time it takes for all of the discs to change position, the position of each disc 10, in sequence, is monitored by the second sensor.

Figure 6:
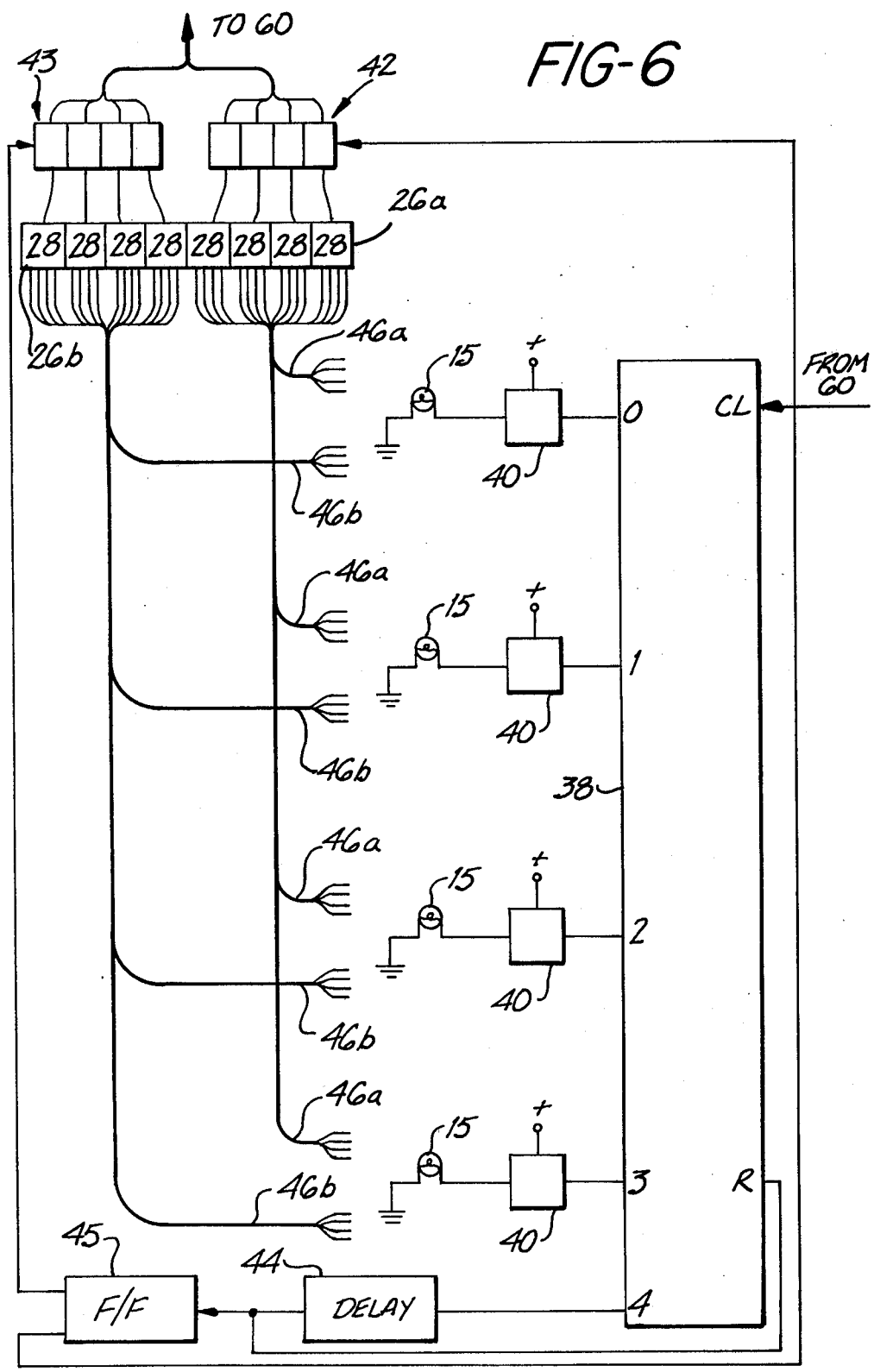
FIG. 6 is a schematic diagram of a portion of the present invention utilizable in conjunction with the modified form of the embodiment illustrated in FIG. 1 which utilizes fiber optic bundles.

FIG. 6 illustrates the manner in which the fiber optic version of the optical embodiment is scanned to obtain the first and second meter readings. In the FIG. 6 embodiment, the decoder 38, electronic switches 40, circuits 42 and 43, delay circuit 44, and flip-flop circuit 45 are identical to those described with respect to FIG. 5 and perform the identical functions. The difference in this version is that only a single photosensitive signal generating means 26, having two rows of photo cells 28, is provided for each meter.

Each disc 10 has two fiber optic bundles 46a and 46b of four fibers each associated with it. The input ends of the bundles 46a and 46b are arranged in the same pattern as the photo cells 28 shown in FIG. 2, that is, two horizontal rows of four fibers each, the rows being offset from each other by a distance greater than the distance between light transmissive segments 24 in adjacent areas 14 of the disc, but less than the distance between adjacent rotational positions of the disc.

The output ends of all first bundles of fibers 46a terminate adjacent the one row of photo cells 28, making up part 26a of photosensitive signal generating means 26, with the first fiber in each first bundle of fibers 46a terminating at the first photo cell 28 in part 26a, the second fiber of each first bundle of fibers 46a terminating adjacent the second photo cell in part 26a, etc. Similarly, the output ends of all second fiber optic bundles 46b associated with each of the discs all terminate adjacent the second row of photo cells 28, making up part 26b of photosensitive signal generating means 26. The first fiber in each of the second fiber bundles 46b terminates adjacent the first photo cell 28 in part 26b, the second fiber from each of the second bundles 46b terminates adjacent the second photo cell in part 26b, etc.

A power signal causes decoder 38 to initially generate a high signal on its 0 output. Circuit 45 actuates circuit 42 to connect the four outputs from part 26a of means 26 to the input of the counter. The high signal on the 0 output of decoder 38 energizes source 15 associated with the first disc 10 and the first and second fiber optic bundles transfer the light patterns to parts 26a and 26b, representing photosensitive signal generating means 26. Parts 26a and 26b of means 26 each generate a BCD code on their four outputs which are connected to the four inputs of circuit 42 and the four inputs of circuit 43, respectively. Circuit 42 passes the BCD code received from part 26a of means 26 to the input of the counter. Circuit 43 blocks the BCD code from part 26b.

On subsequent clock signals, the light source 15 associated with each of the discs 10 are illuminated, in sequence, and only the BCD code generated from the row of photo cells 28, making up part 26a of means 26, is passed through circuit 42. On the fifth pulse, output number 4 of decoder 38 is high, actuating delay circuit 44. After a time delay sufficient to permit all of the discs 10 to change position, delay circuit 44 generates a pulse which is applied to the reset terminal of decoder 38, resetting same. In addition, this pulse is fed to the input of flip-flop 45 which generates a high output signal to the control input of circuit 43, causing circuit 43 to connect each of the outputs of part 26b of means 26 to the counter input. The other output of circuit 45 is now low, causing circuit 42 to prevent the BCD code from part 26a of means 26 to be applied to the counter input.

The 0 output of decoder 38 now becomes high and the BCD code generated by the row of photo cells 28, making up part 26b of means 26, is passed through circuit 43. Subsequent clock pulses cause decoder 38 to energize the light sources 15 associated with each of the other discs 10, in sequence, such that each BCD code generated by the row of photo cells making up part 26b of means 26, representing the second reading for each disc, passes through circuit 43.

Thus, in this version, a first BCD code representing the pattern read by the first fiber optic bundle associated with each disc, in turn, is generated. After a delay of sufficient time, the BCD code representing the pattern observed by each of the second fiber optic bundles, in turn, is then generated. The result is identical to that of the version disclosed in FIGS. 5, but only a single photosensitive signal generating means is required.

FIG. 7 illustrates the circuitry which is situated within the meter and associated with the sensing means shown in FIGS. 5 and 6. The circuit comprises a power signal receiver 50 which may be an induction coil or a photosensitive signal generating means such as an infrared detector, a photo cell, etc. The power signal receiver 50 receives a power signal from the remote unit, which is either an AC sinewave, if an induction coil is used, or a pulsed light signal, if a light receiver is used. One output of power signal receiver 50 is connected to the input of a rectifier 52 which converts the power signal into a stabilized DC power signal which is utilized as an input to electronic switches 40 to energize the light sources 15 associated therewith.

Another output of signal receiver 50 is connected to a pulse shaper 54 which generates a pulse train, at the same frequency as the received power signal, for as long as the power signal is received. Pulse train generated by pulse shaper 54 is connected to one input of a NAND gate 56 and to the clock input of a counter/divider 58 (IC 4017). NAND gate 56 is normally opened and the pulses from pulse shaper 54 pass therethrough to the clock input of a counter 60, the parallel inputs of which are connected to receive each BCD code from the outputs of circuit 42 or 43.

The output of gate 56 is also connected to the input of a data signal transmitter 62 which is connected between the positive output of rectifier 52 and ground. Data signal transmitter 62 may comprise a resistor, the output circuit of a transistor, and either an FM transmitter or a controllable light emitter, connected in series. The output of gate 56 is connected to the control terminal of the transistor. If an FM transmitter is utilized, the FM transmitter comprises an FM carrier signal generator which generates an FM signal at a constant frequency. This FM signal is passed through a modulator connected to receive the output signal from the transistor and to modulate the frequency of the carrier signal in a pulse-like fashion, in accordance with the input to the control terminal of the transistor, so as to transmit the data signal. Alternatively, a controllable light source can be used. In this instance, the output of the transmitter is connected to energize the light source in accordance with the output of gate 56 so as to generate light pulses.

The "0" output of counter 60 is connected to generate the clock signal to decoder 38 and is also connected through an inverter 64 and a resistor 65 to the other input of gate 56 and the reset terminal of the counter 58. When the "0" output of counter 60 is high, decoder 38 is clocked and pulses from pulse shaper 54 are prevented from passing through gate 56, which is opened by the high signal from the "0" output of counter 60. In addition, a high signal on the "0" output of counter 60 resets counter 58.

Counter 60 initially generates a high signal at its "0" output when the power signal is received. This causes decoder 38 to generate a high signal on its "0" output and cause the generation of a BCD code by the first sensing means associated with the first disc. The high signal on the "0" output of counter 60 causes counter 58 to generate a "load" signal to the load input of counter 60, causing counter 60 to load the BCD code from gate circuit 42.

Pulses from pulse shaper 54 pass through gate 56 to the clock terminal of counter 60 which is indexed thereby. The output of gate 56 is also applied to the data input of data signal transmitting means which transmits a pulse for each pulse passing through NAND gate 56. When counter 60 reaches its "0" output, indicating that it has been indexed a number of times equal to the number represented by the BCD code, "0" output becomes high, causing NAND gate 56 to open, preventing further pulses from being transmitted by transmitter 62 and indexing decoder 38 to energize its next output. This signal also causes counter 58 to reset. Energizing the next output of decoder 38 causes the BCD code generated by the first sensor associated with the next disc to pass through gate circuit 42 and be loaded into counter 60. Counter 60 is indexed until its "0" output becomes high and the cycle repeats itself for each BCD code generated by each sensor for each disc 10, in turn.

In this manner, the data signal which is transmitted by transmitter 62 comprises a plurality of pulse trains, each pulse train containing a number of pulses which represents the BCD code generated by one sensor associated with one of the discs. The first four pulse trains represent the first reading of each of the discs and the second four pulse trains represent the second reading for each of the discs.

FIG. 8 illustrates the circuitry to be used in conjunction with the electrical embodiment of the sensor disclosed in FIGS. 3 and 4. In this embodiment, the counters are replaced by a set of four high output line decoders 70 (IC 4514), one of which is provided for each of the discs 10. Only one decoder 70 is shown in the Figure. Each decoder 70 has ten outputs which are connected, respectively, to the ten conductive section inputs on the base 34 associated with the disc 10, the position of which is to be sensed. Power signal receiver 50, rectifier 52, pulse shaper 54, NAND gate 56 and transmitter 62 all function as in FIG. 7.

Each decoder 70 initially generates a high signal at its "0" output. Upon the first clock pulse, the high signal is applied to the first output and, for each subsequent clock pulse, the high signal is applied to the next output, in turn.

The outputs A and B for each base 34 are respectively connected to the inputs of two electronically controlled switches S, supplied for each disc 10. Thus, eight switches S in all are required. The control input of each switch $S_1 \ldots S_8$ is connected to a different output of a high output decoder 72. The "A" output from each of the four bases 34 associated with each disc 10 is connected to the input terminal of each switch $S_1 \ldots S_4$, respectively. The "B" output terminal of the four bases 34 associated with the four discs 10 is connected to the input terminal of each switch $S_5 \ldots S_8$, respectively. The clock input of decoder 72 is connected to the "0" output of each decoder 70.

The "0" output of decoder 72 is initially high, thus, switch $S_1$ is initially closed. When a high signal appears on output A of base 34, indicating that the section 34 associated with the position of the first disc 10 has been energized by decoder 70, this output passes through switch $S_1$ and is applied to one input of NAND gate 56. This serves to turn off NAND gate 56 such that the clock signals to decoder 70 from pulse shaper 54 cease and the pulses transmitted by data signal transmitter 62 also cease.

The signal from switch $S_1$ is also applied to the reset terminal of all decoders 70 which resets same to again generate a high signal at its "0" output which, in turn, clocks decoder 72 to generate a high signal at its next output (No. 1), which is connected to electronic switch $S_2$. This causes electronic switch $S_1$ to turn off, again closing gate 56. The clock signals index the decoder 70 associated with the second disc 10 whose A output is connected to switch $S_2$. This decoder 70 is indexed until a high signal is generated on its output A which stops the transmission of pulses, causes decoder 70 to index decoder 72 to close switch $S_3$ which is connected to the A output of the base 34 associated with the next disc in sequence.

The cycle repeats itself until a high output is received at switch $S_4$ which, in addition to turning off NAND gate 56 and resetting decoder 70, actuates a delay circuit 74. Circuit 74 controls a gate 75 interposed between gate 56 and the clock input of decoders 70. Gate 75 prevents pulses from indexing decoders 70 and from being transmitted by transmitter 62 for a suitable period. After the time delay, the first decoder 70 will be reset and the position of each of the discs 10 will be sensed a second time and a pulse train representing the thus sensed position will be generated and transmitted.

FIG. 9 shows a diagram of the remote unit which can be used with the circuits illustrated in either FIG. 7 or FIG. 8. This unit comprises an "on/off" switch 80 which, when actuated, generates a reset signal and also energizes an oscillator 82 to generate a sinewave to power signal transmitter 84, which may be in the form of an induction coil or a light transmitter, which transmit the power signal to power signal receiver 50 in the meter unit. The data signal from data signal transmitter 62 is received in the remote unit by data signal receiver 86 which may be an FM receiver or a photosensitive signal generating means, depending upon the nature of transmitter 62.

The output of data signal receiver 86 is connected to a pulse shaping circuit 88 and then to the clock input of a digital counter (IC 4518) which will count the pulses in the first pulse train. Each of the pulses from the output of pulse shaper 88 is also connected to the control terminal of a transistor 92. The output circuit of transistor 92 is connected between ground and one pole of a capacitor 94 which, in turn, is connected through resistor 96 to a positive source. The other side of capacitor 94 is connected to ground. Capacitor 94 is thus charged through resistor 96. However, each pulse input to transistor 92 functions to discharge capacitor 94. When the pulses cease (indicating the end of a pulse train), capacitor 94 charges to a preset level, energizing the "read out" input of counter 90, causing the number therein to be applied to its output and, after a brief time delay, causes counter 90 to reset.

The output of counter 90 is connected to the input of each one of two electronic switches 98 and 100, only one of which is closed at a time. Electronic switches 98 and 100 are connected, respectively, to different outputs of a bistable circuit 102. The control input of bistable circuit 102 is connected to the output of a divide-by-four counter 104 which, in turn, is connected to be indexed by the same signal which causes counter 90 to read out its contents.

Each of the switches 98 and 100 is connected to a temporary memory 106, 108, respectively, which consists of multiple latches (IC 4508) or the like. Assume bistable circuit 102 generates a high output to switch 98, closing same, and a low output to switch 100, opening same. Each of the four numbers appearing in sequence at the output of counter 90 and representing the first sensing of the position of each of the four digit wheels, is thus stored in sequence in the first temporary memory 106. After the pulses in the fourth pulse train have been counted and the number representing the first sensing has been loaded into memory 106, the output of counter 104 goes high, causing bistable circuit 102 to change its state, opening switch 98 and closing switch 100. The next four pulse trains will then be counted, in sequence, and each will be read out of counter 90, passed through switch 100, and into temporary memory 108 which will then contain the four digit number representative of the second sensing of each of the discs 10.

At this point, a comparator compares the numbers in the temporary memories 106 and 108, and selects one number (usually the higher number) for application to the electronic main memory 112 (MM 2114) and also applies this number to a display driver 114 such that the stored number appears at display 116.

Each time switch 80 is actuated, a signal is generated to address control circuit 118 such that the next output of comparator 110 (relating to the reading of the next meter) will be stored in the next location in the main memory 112.

The circuits illustrated in FIGS. 7, 8 and 9 hereof are illustrated in block form. While it is believed that same should be sufficient to permit the reader to fully appreciate the operation of the present invention, schematic diagrams of similar circuits are illustrated and the operation therefore described in detail in above-mentioned U.S. applications. These illustrations and the descriptions of the circuits therein are incorporated herein by reference, as if same had been fully set forth herein.

It will now be appreciated that the present invention relates to apparatus for electronically reading mechanical meters which eliminates the problems associated with non-simultaneously changing digits. Two sensors, physically spaced along the direction of movement of each movable meter member, are utilized to sense the position of each movable member, in sequence, at different times, separated by a delay longer than the time it takes for all of the members to change position. The sensing operation is achieved in the optical embodiment without creating any load to the movable component, and in the electrical embodiment by applying only a minimal load to the movable component. In addition, fiber optics may be utilized to reduce the number of sensors required within each meter.

While only a limited number of preferred embodiments have been disclosed herein for purposes of illustration, it is obvious that many variations and modifications could be made thereto. It is intended to cover all of these variations and modifications which fall within the scope of the present invention, as defined by the following claims:

We claim:

1. Apparatus for detecting the position of first and second members, each of which is movable to one of a given number of positions, said apparatus comprising, for each member, first means effective when actuated to sense the position of said member; second means effective, when actuated, to sense the position of said member, said first and second sensing means being spaced apart, along the direction of movement of said member, by a distance less than the distance between adjacent positions of said member; means for actuating each of said first sensing means, in sequence; means for actuating each of said second sensing means, in sequence, a given time after actuation of said first sensing means, said given time being greater than the time it takes for both members to move between adjacent positions; first means for storing a first number representative of the respective positions sensed by each of said first sensing means; second means for storing a second number representative of the respective positions sensed by each of said second sensing means; and means for comparing said stored numbers and for selecting one of said stored numbers.

2. The apparatus of claim 1, wherein each of said members carries a number of patterns thereon equal to said given number, each of said patterns representative of one of said positions, and wherein said first and second sensing means each comprise means for sensing the pattern aligned therewith and for generating a code representative of said aligned pattern.

3. The apparatus of claim 2, wherein each of said members is a rotatable drum, said patterns comprise light transmissive sections and opaque sections on the surface of said drum, said first and second sensors each comprise photosensitive signal generating means and further comprising means for illuminating said sections.

4. The apparatus of claim 3, wherein said photosensitive signal generating means comprises a plurality of photo cells, a different one of which is aligned with each of said sections.

5. The apparatus of claim 2, wherein each of said patterns comprises four of said sections and wherein said code representative of said aligned pattern is in BCD form.

6. The apparatus of claim 1, further comprising a number of spaced conductive sections associated with each member, said number of said conductive sections being equal to said given number, one of said sections corresponding to each of said positions and wherein each of said sensing means comprises a contact carried by said member, each of said contacts having one end situated to engage the section aligned therewith and a second end connected to the corresponding storage means, each of said storage means comprising means for applying a signal to each of said sections, in sequence, means for detecting the presence of said signal on the contact connected thereto and means for recording the number of the section to which said signal is applied when the presence thereof on the contact connected thereto is detected.

7. The apparatus of claim 6, wherein said member is a rotatable disc, said contacts are carried by one side of said disc and said sections are situated on a base adjacent said side.

8. The apparatus of claim 7, wherein said sections are situated in a circular pattern on said base.

9. The apparatus of claim 7, further comprising first and second conductive rings on said base, each of said rings continuously engaging said other end of a different one of said contacts, as said contacts are moved by said disc.

10. The apparatus of claim 9, wherein each of said detecting means is connected to a different one of said rings.

11. The apparatus of claim 1, wherein said members form a part of a meter and the position of each of said members represents a digit in the meter reading.

12. The apparatus of claim 11, further comprising means, connected to each set of said first and said second sensors, for generating a data signal, said data signal comprising pulse trains, each pulse train having a number of pulses representative of a different one of said sensed positions and means for transmitting said data signal.

13. The apparatus of claim 12, further comprising means for receiving said data signal, means for counting the number of pulses in each of said pulse trains and means for transferring each of said counted numbers to said storing means.

14. The apparatus of claim 13, further comprising means for generating a power signal and means for transmitting said power signal.

15. The apparatus of claim 14, further comprising means for receiving said power signal and means for applying said power signal to said first and second sensing means to energize same.

16. The apparatus of claim 14, further comprising means for converting said power signal into a power signal pulse train, said data signal generating means comprising means for selecting first and second given numbers of pulses from a power signal pulse train and forming said data signal therefrom, said given numbers of pulses being representative of said first and second sensed positions, respectively.

* * * * *